(12) United States Patent
Nikitin (10) Patent No.: US 11,450,593 B2
(45) Date of Patent: Sep. 20, 2022

(54) SPACER FRAME FOR SEMICONDUCTOR PACKAGES

(71) Applicant: Infineon Technologies AG, Neubiberg (DE)

(72) Inventor: Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 16/919,654

(22) Filed: Jul. 2, 2020

(65) Prior Publication Data
US 2022/0005752 A1 Jan. 6, 2022

(51) Int. Cl.
| | | |
|---|---|---|
| *H01L 23/495* | (2006.01) | |
| *H01L 21/48* | (2006.01) | |
| *H01L 21/56* | (2006.01) | |
| *H01L 23/31* | (2006.01) | |

(52) U.S. Cl.
CPC .... *H01L 23/49541* (2013.01); *H01L 21/4821* (2013.01); *H01L 21/4825* (2013.01); *H01L 21/565* (2013.01); *H01L 23/3157* (2013.01); *H01L 23/49537* (2013.01); *H01L 23/49575* (2013.01); *H01L 23/49579* (2013.01)

(58) Field of Classification Search
CPC .............. H01L 21/4825; H01L 21/565; H01L 23/3157; H01L 21/4821; H01L 21/4839; H01L 21/4842; H01L 23/495; H01L 23/49517; H01L 23/49524; H01L 23/49534; H01L 23/49537; H01L 23/49541; H01L 23/49548; H01L 23/49565; H01L 23/49575; H01L 23/52; H01L 23/522; H01L 23/528
See application file for complete search history.

(56) References Cited

U.S. PATENT DOCUMENTS

| | | | | |
|---|---|---|---|---|
| 5,796,162 | A * | 8/1998 | Huang | H01L 23/4951 257/666 |
| 6,281,043 | B1 * | 8/2001 | O'Brien | H01L 23/49537 257/E23.042 |
| 2004/0021229 | A1 * | 2/2004 | Kinsman | H01L 23/49575 257/777 |
| 2009/0102034 | A1 * | 4/2009 | Pagkaliwangan | H01L 23/49575 257/676 |
| 2014/0191381 | A1 * | 7/2014 | Lee | H01L 23/49575 257/676 |
| 2016/0211203 | A1 * | 7/2016 | Huang | H01L 23/49562 |

\* cited by examiner

*Primary Examiner* — Eduardo A Rodela
(74) *Attorney, Agent, or Firm* — Murphy, Bilak & Homiller, PLLC (57) ABSTRACT

A method of frame handling during semiconductor package production includes: providing a lead frame having leads secured to a periphery of the lead frame by first tie bars; providing a multi-gauge spacer frame having spacers secured to a periphery of the spacer frame by second tie bars, the spacers being thicker than the second tie bars; and aligning the multi-gauge spacer frame with the lead frame such that the spacers and the second tie bars of the multi-gauge spacer frame do not contact the leads of the lead frame. A power semiconductor module and a method of assembling a power semiconductor module are also described.

17 Claims, 10 Drawing Sheets

SPACER FRAME FOR SEMICONDUCTOR PACKAGES

BACKGROUND

For single-sided cooled semiconductor packages, heat dissipation only occurs through the bottom of the package via a substrate. For double-sided cooled semiconductor packages, a metal spacer is typically soldered to the top of the semiconductor die (chip) so that heat is dissipated from the top of the die via the metal spacer and from the bottom side via a substrate. In the case of AlSiC metal spacers, AlSiC spacers are individually manufactured from a large plate with the same thickness and cut with a diamond sawing blade to yield separate spacers which are delivered as separate components. During packaging assembly, the AlSiC metal spacers are loaded into an apparatus which singly mounts the spacers on semiconductor dies and the dies are mounted on a substrate. The components are then soldered. This process is complex, demands special tooling, and is slow. Yield and reliability problems also arise during the soldering process if the spacers rotate when seated in molten solder. This also means that spacer positioning accuracy is determined by the movement of the separate spacers in molten solder material. Also, if the edge of a spacer is stressed by the passivation (e.g. imide) layer of the corresponding semiconductor die, the die may be damaged after 10K to 20K thermal cycles.

Thus, there is a need for a lower cost, reduced complexity and more reliable metal spacer product and assembly process for producing double-sided cooled semiconductor packages.

SUMMARY

According to an embodiment of a method of frame handling during semiconductor package production, the method comprises: providing a lead frame having leads secured to a periphery of the lead frame by first tie bars; providing a multi-gauge spacer frame having spacers secured to a periphery of the spacer frame by second tie bars, the spacers being thicker than the second tie bars; and aligning the multi-gauge spacer frame with the lead frame such that the spacers and the second tie bars of the multi-gauge spacer frame do not contact the leads of the lead frame.

According to an embodiment of a method of assembling a power semiconductor module, the method comprises: aligning a lead frame and a multi-gauge spacer frame with a first substrate, the lead frame comprising leads secured to a periphery of the lead frame by first tie bars, the multi-gauge spacer frame comprising spacers secured to a periphery of the spacer frame by second tie bars, wherein the spacers are thicker than the leads, the first tie bars and the second tie bars; connecting at least some of the leads to contact pads of the first substrate; attaching at least some of the spacers to semiconductor dies on the first substrate, at a side of the semiconductor dies facing away from the first substrate; applying a mold compound such that the first tie bars, the second tie bars, the side of the spacers facing away from the first substrate, and a side of the first substrate facing away from the spacers each remain at least partly uncovered by the mold compound; and severing the first tie bars connected to the periphery of the lead frame and the second tie bars connected to the periphery of the multi-gauge spacer frame, to separate the power semiconductor module from the lead frame and the multi-gauge spacer frame.

According to an embodiment of a power semiconductor module, the power semiconductor module comprises: a plurality of semiconductor dies attached to a first substrate; first leads of a lead frame connected to contact pads of the first substrate; first spacers of a multi-gauge spacer frame attached to the semiconductor dies at a side of the semiconductor dies facing away from the first substrate; a mold compound encapsulating the semiconductor dies and having side faces that extend between a first main surface and a second main surface of the mold compound; first tie bars connected to the first leads and each having a severed end that is at least partly uncovered by the mold compound at one of the side faces of the mold compound; and second tie bars connected to the first spacers and each having a severed end that is at least partly uncovered by the mold compound at one of the side faces of the mold compound, wherein a side of the first spacers facing away from the first substrate is at least partly uncovered by the mold compound at the first main surface of the mold compound, wherein a side of the first substrate facing away from the first spacers is at least partly uncovered by the mold compound at the second main surface of the mold compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1D illustrate different views of an embodiment of a multi-gauge spacer frame, where

FIGS. 2A through 2D illustrate an embodiment of a multi-gauge spacer frame and substrate assembly, where

FIGS. 3A through 3D illustrate a method of frame handling during semiconductor package production, where

FIGS. 4A through 4D illustrate a method of attaching a second substrate to the spacers of the multi-gauge spacer frame, where

FIGS. 5A through 5D illustrate a method of applying a mold compound to the multi-gauge spacer frame assembly to form a molded power semiconductor module, where

DETAILED DESCRIPTION

The embodiments described herein provide a multi-gauge spacer frame having interconnected spacers, a method of assembling a power semiconductor module using the multi-gauge spacer frame, and a corresponding power semiconductor module produced from the multi-gauge spacer frame. By interconnecting individual spacers via a multi-gauge spacer frame, spacer positioning accuracy is no longer determined by the movement of separate spacers in molten solder but instead by the position of the overall multi-gauge spacer frame with respect to a lead frame and the accuracy of the multi-gauge spacer frame manufacturing process. Described next are embodiments of the multi-gauge spacer frame, the method of assembling a power semiconductor module using the multi-gauge spacer frame, and a corresponding power semiconductor module produced from the multi-gauge spacer frame.

Figure 1A:
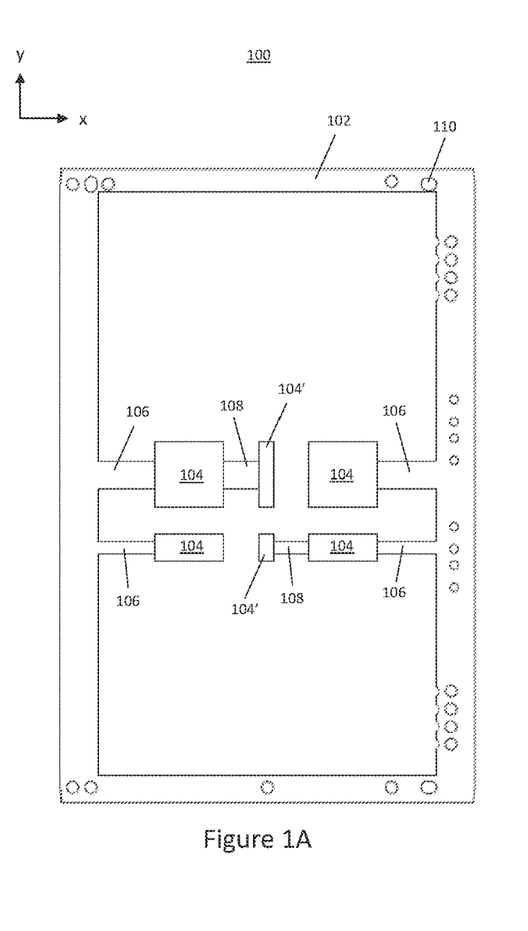
FIG. 1A illustrates atop plan view of the multi-gauge spacer frame.
Figure 1B:
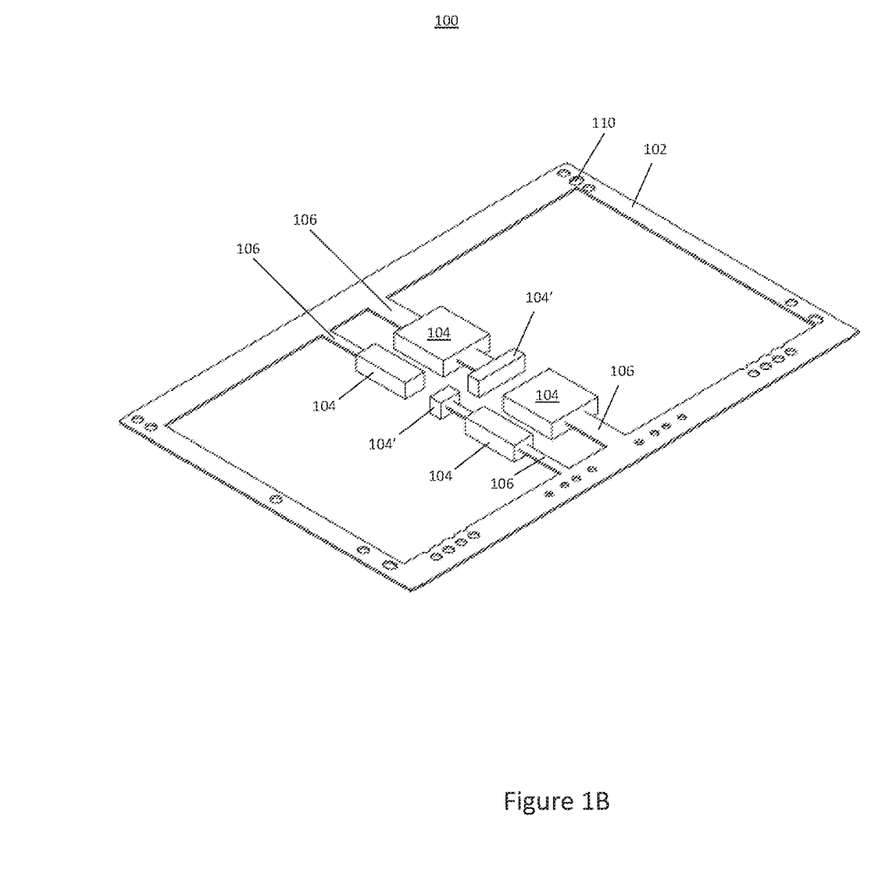
FIG. 1B illustrates a top-side perspective view of the multi-gauge spacer frame.
Figure 1C:
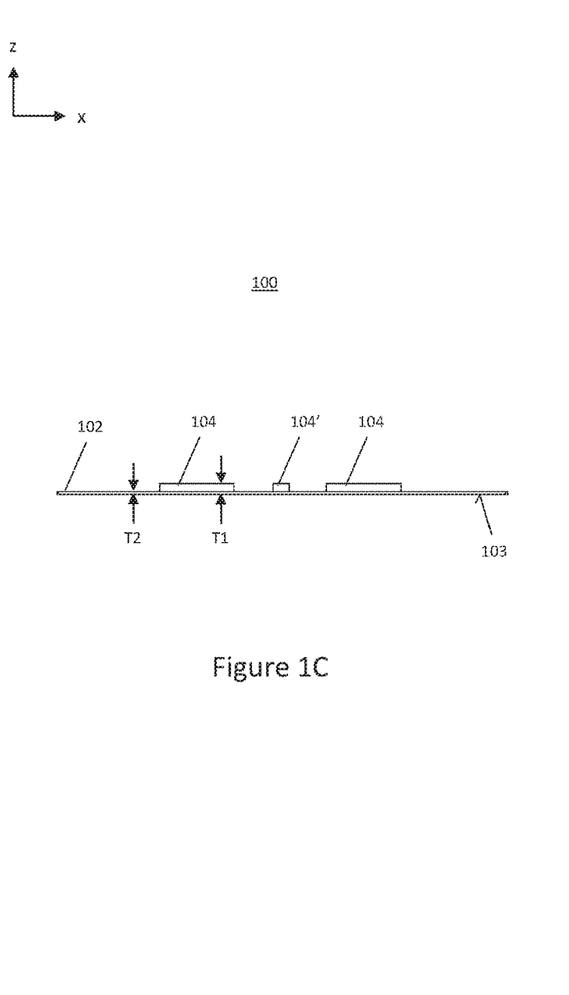
FIG. 1C illustrates a side view of the multi-gauge spacer frame taken in the y-direction of FIG. 1A.
Figure 1D:
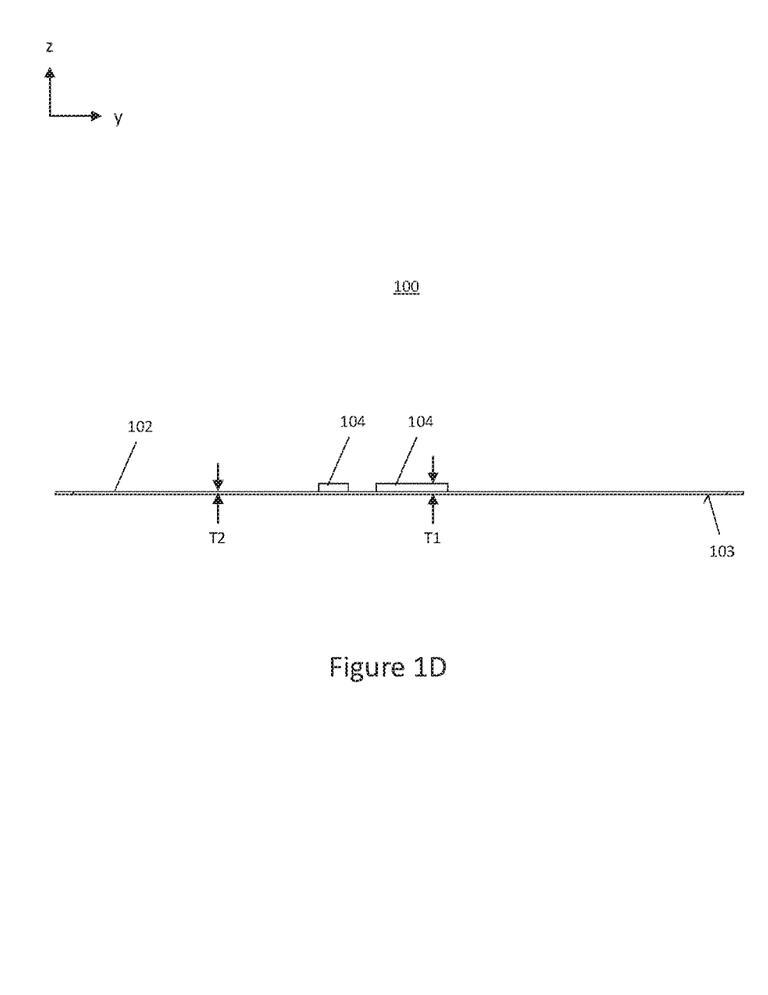
FIG. 1D illustrates a side view of the multi-gauge spacer frame taken in the x-direction of FIG. 1A.

FIGS. 1A through 1D illustrate different views of an embodiment of a multi-gauge spacer frame 100. FIG. 1A illustrates a top plan view of the multi-gauge spacer frame 100. FIG. 1B illustrates a top-side perspective view of the multi-gauge spacer frame 100. FIG. 1C illustrates a side view of the multi-gauge spacer frame 100 taken in the y-direction of FIG. 1A. FIG. 1D illustrates a side view of the multi-gauge spacer frame 100 taken in the x-direction of FIG. 1A. The z-direction in FIGS. 1C and 1D indicates thickness or height of the multi-gauge spacer frame 100.

The multi-gauge spacer frame 100 includes a periphery 102 and spacers 104 secured to the periphery 102 by tie bars 106. The spacers 104 are thermally conductive and thus enable double-sided cooling, as will be described in more detail later herein.

The tie bars 106 that secure the spacers 104 to the periphery 102 of the multi-gauge spacer frame 100 are provided to spacer positioning accuracy during the package assembly process and are eventually severed (cut) to release the spacers 104 from the periphery 102. Hence, the periphery 102 of the multi-gauge spacer frame 100 does not form part of the final packaged device.

Some spacers 104' may be laterally spaced inward further from the periphery 102 than other spacers 104. In this case, the multi-gauge spacer frame 100 may include additional tie bars 108 that interconnect the inwardly positioned spacers 104' to respective outwardly positioned spacers 104 without contacting the periphery 102 of the multi-gauge spacer frame 100.

The spacer frame 100 is considered 'multi-gauge' in that the spacers 104, 104' are thicker than the tie bars 106, 108. With specific reference to FIGS. 1C and 1D, this means that the spacers 104, 104' have a first thickness T1 (in the z-direction) and the tie bars 106, 108 have a second thickness T2 (in the z-direction) that is less than T1. Some or all of the spacers 104, 104' may be coplanar with the bottom surface 103 of the lead frame periphery 102. That is, some or all of the spacers 104, 104' may terminate in the same plane as the bottom surface 103 of the lead frame periphery 102, e.g., as shown in FIGS. 1C-1D. Alternatively, some or all of the spacers 104, 104' may vertically extend below the bottom surface 103 of the lead frame periphery 102, e.g., as shown in FIGS. 2C-2D, 3C-3D and 4C-4D.

In the case where T1 is the same for all spacers 104, 104' and T2 is the same for all tie bars 106, 108 and the periphery 102, the spacer frame 100 may be considered dual-gauge. According to this embodiment, the multi-gauge spacer frame 100 has a first gauge that corresponds to the uniform thickness T1 of the spacers 104, 104' and a second gauge that corresponds to the uniform thickness T2 of the tie bars 106, 108 and the periphery 102 of the spacer frame 100, with the first gauge being lower than the second gauge.

However, some spacers 104, 104' may have a different thickness than other spacers 104, 104', e.g., to accommodate semiconductor dies of different thicknesses and/or in the case of no underlying semiconductor die for some spacers 104, 104'. Similarly, some tie bars 106, 108 may have a different thickness than other tie bars 106, 108. For example, the tie bars 108 that interconnect the inwardly positioned spacers 104' to respective outwardly positioned spacers 104 may be thicker or thinner than the tie bars 106 that connect to/contact the periphery 102 of the multi-gauge spacer frame 100. In each of these cases, the spacer frame 100 has more than 2 gauges, with each gauge corresponding to a different spacer or tie bar thickness. The periphery 102 may have the same thickness as the tie bars 106, 108 as shown in FIGS. 1C and 1D, or a different thickness. The multi-gauge spacer frame 100 may include alignment structures 110 such as holes for use in subsequent package assembly processes.

The multi-gauge spacer frame 100 may be made of any suitable thermally conductive material such as AlSiC, Cu, CuW, CuMo, Al, nickel, iron, zinc, metal alloys, plated materials such as Al with Cu, Ag or Au coating, etc. The multi-gauge spacer frame 100 may be produced by stamping or punching, chemical etching, laser etching, 3D printing, forging, casting, metal matrix composite processing, etc. For example, in the case of AlSiC, the multi-gauge spacer frame 100 may be produced by pressing a SiC powder into the general form of the multi-gauge spacer frame 100 and impregnating the SiC powder with liquid Al in a vacuum process. The result is a matrix of Al which holds SiC particles in one part (Al matrix between SiC particles). Unlike conventional AlSiC spacers which are produced as standalone (separate) components, the spacer frame 100 includes tie bars 106, 108 for interconnecting the spacers 104, 104' and (temporarily) securing the spacers 104 to the periphery 102 of the multi-gauge spacer frame 100.

In the case of a metal or metal alloy as the material for the multi-gauge spacer frame 100, the spacer frame 100 may be produced by stamping or punching, chemical etching, laser etching, 3D printing, forging, casting, etc. The multi-gauge spacer frame 100 may be one of several multi-gauge spacer frames produced from the same panel which may be formed, e.g., from a metal sheet.

Figure 2A:
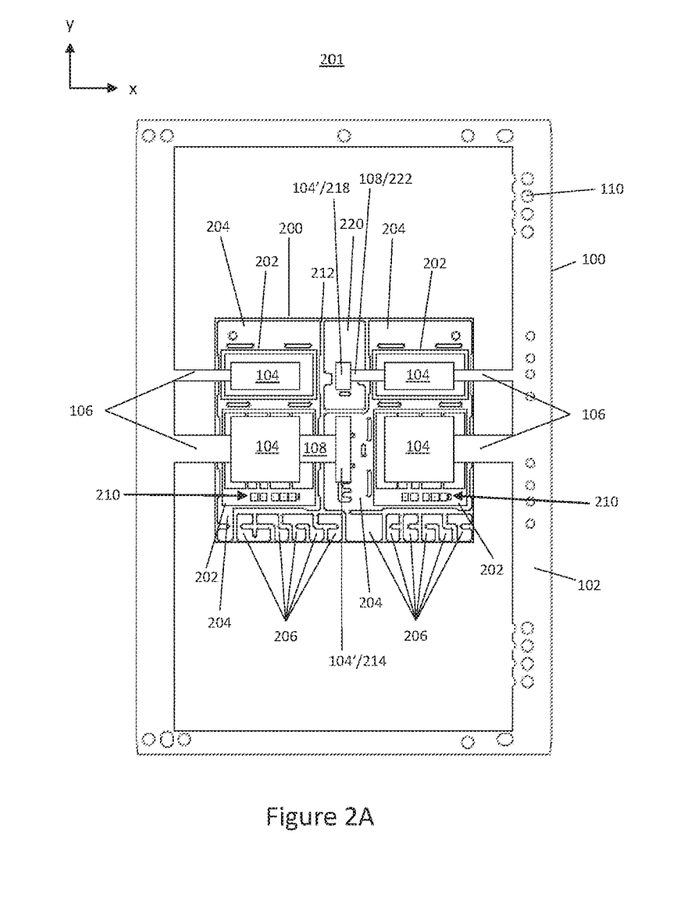
FIG. 2A illustrates a top plan view of the multi-gauge spacer frame after being attached to a substrate.
Figure 2B:
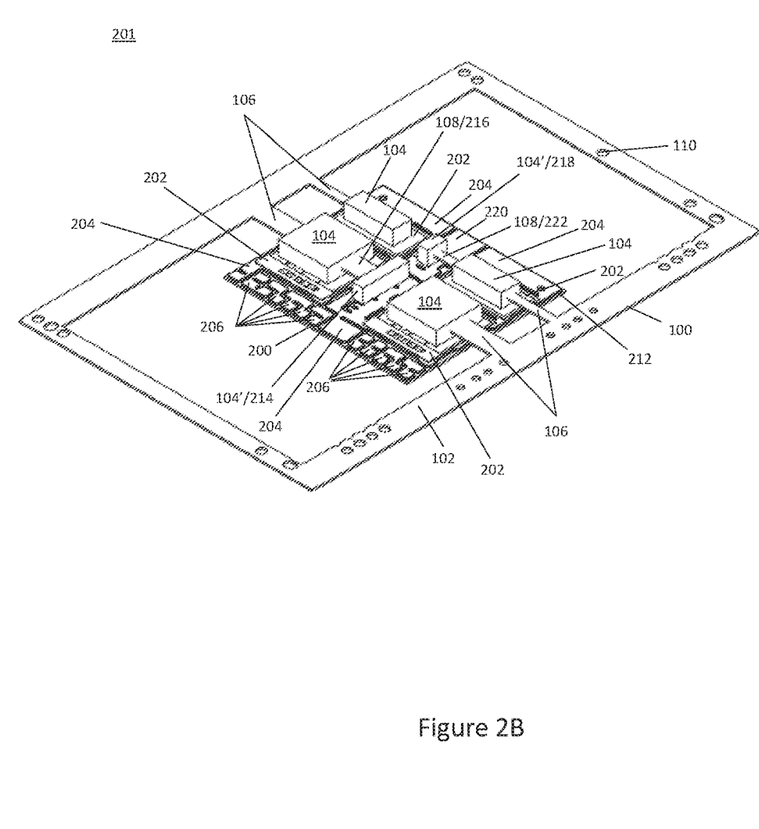
FIG. 2B illustrates a corresponding top-side perspective view.
Figure 2C:
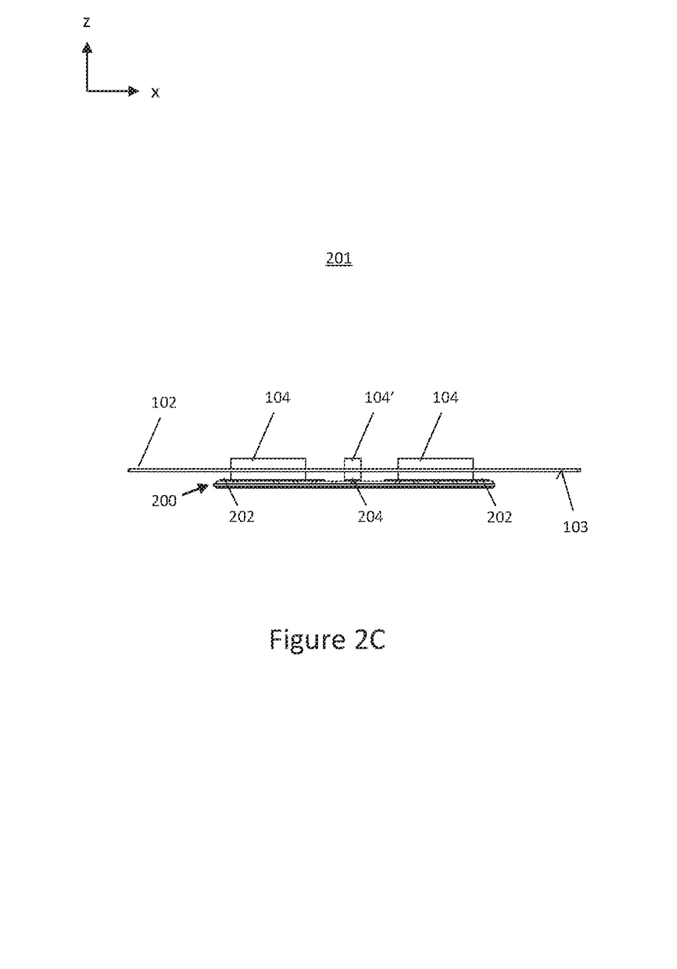
FIG. 2C illustrates a side view taken in the y-direction of FIG. 2A.
Figure 2D:
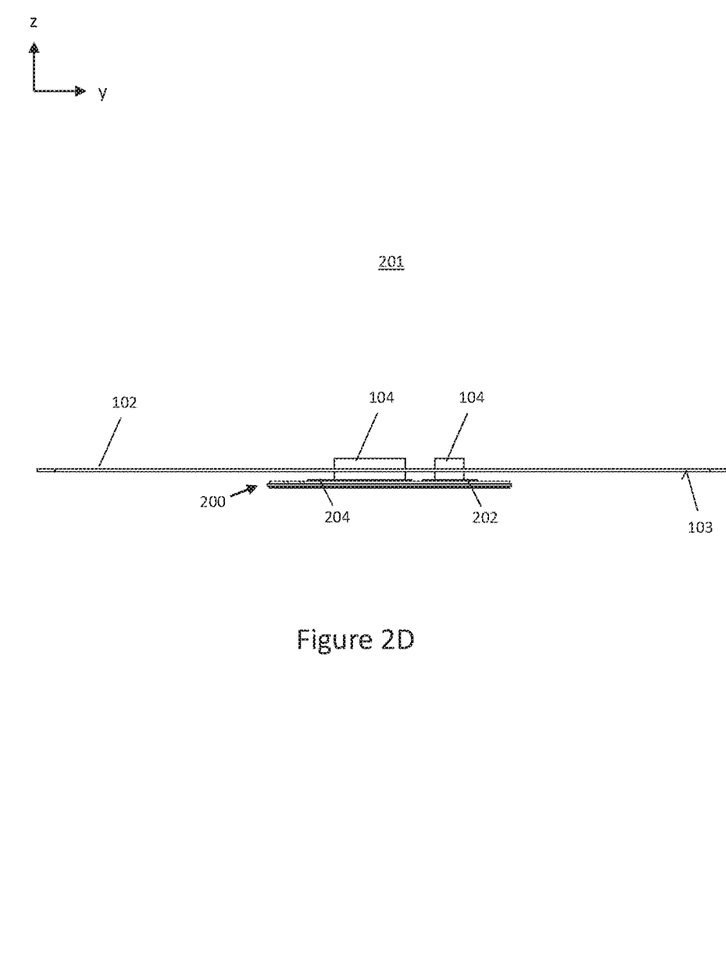
FIG. 2D illustrates a side view taken in the x-direction of FIG. 2A.

FIGS. 2A through 2D illustrate an embodiment of a multi-gauge spacer frame and substrate assembly 201. FIG. 2A illustrates a top plan view of the multi-gauge spacer frame 100 after being attached to a substrate 200. FIG. 2B illustrates a corresponding top-side perspective view. FIG. 2C illustrates a side view taken in the y-direction of FIG. 2A. FIG. 2D illustrates a side view taken in the x-direction of FIG. 2A. The z-direction in FIGS. 2C and 2D indicates thickness or height of the multi-gauge spacer frame and substrate assembly 201.

At least one semiconductor die 202 is attached to the substrate 200 and the outwardly positioned spacers 104 of the multi-gauge spacer frame 100 are attached to respective ones of the semiconductor dies 202 at a side of the dies 202 facing away from the substrate 200. The substrate 200 may or may not be insulated. For example, the substrate 200 may be insulated by the end customer after the multi-gauge spacer frame 100 is attached to the substrate 200. The substrate 200 provides electrical connections to each semiconductor die 202. The substrate 200 may be a lead frame, a circuit board such as a PCB (printed circuit board), a DBC (direct bonded copper) substrate, an AMB (active metal brazed) substrate, an IMS (insulated metal substrate), etc.

The substrate 200 includes first patterned metallization regions 204 to which the respective semiconductor dies 202 are attached and second patterned metallization regions 206 which form contact pads that provide electrical connections to corresponding terminals 210 of the semiconductor dies 202. In the case of a DBC, AMB or IMS substrate, the first and second patterned metallization regions 204, 206 may be formed on an electrically insulating substrate 212 such as a ceramic material, an epoxy-based layer, etc. Electrical conductors such as metal clips, wire bonds, wire ribbons, etc. may connect the second patterned metallization regions 206 to the corresponding terminals 210 of the semiconductor dies 202 and are not shown in FIGS. 2A and 2B so as to not obstruct the view of the multi-gauge spacer frame 100 and substrate 200.

In one embodiment, the semiconductor dies 202 attached to the substrate 200 form part of a power inverter or converter such as a buck converter, a boost converter, a buck/boost converter, a switched-capacitor converter, a single-phase or multi-phase inverter, etc. For example, the semiconductor dies 202 attached to each same first patterned metallization region 204 of the substrate 200 may include an IGBT (insulated gate bipolar transistor) die and a power diode die coupled antiparallel with the IGBT die. FIGS. 2A and 2B show two such groupings of semiconductor dies 202, where one grouping may form a high-side switch device of the power inverter or converter and the other grouping may form a low-side switch device of the power inverter or converter. The semiconductor dies 202 may instead be power MOSFET (metal-oxide-semiconductor field effect transistor) dies with integrated body diodes, HEMT (high-electron mobility transistor) dies, etc.

In some cases, and if provided as part of the overall package design, a first one 214 of the inwardly positioned spacers 104' of the multi-gauge spacer frame 100 may be attached to one of the first patterned metallization region 204 of the substrate 200. The corresponding tie bar 108/216 may complete an internal switch node connection for a branch of the power inverter/converter such as a half bridge switch node or phase connection between high-side and low-side switch devices of the same branch. A second one 218 of the inwardly positioned spacers 104' of the multi-gauge spacer frame 100 may be attached to a different patterned metallization region 220 of the substrate 200. The inwardly positioned spacers 104' may be electrically connected (not shown) to form a switch node/phase output at the patterned metallization region 220 of the substrate 200 connected to the first inwardly positioned spacer 214 of the multi-gauge spacer frame 100.

As previously described herein, the inwardly positioned spacers 104' of the multi-gauge spacer frame 100 may be thicker than the outwardly positioned spacers 104, e.g., if the outwardly positioned spacers 104 are attached to respective semiconductor dies 202 and the inwardly positioned spacers 104' are instead attached to respective patterned metallization regions 204, 220 of the substrate 200 as shown in FIGS. 2A and 2B.

Figure 3A:
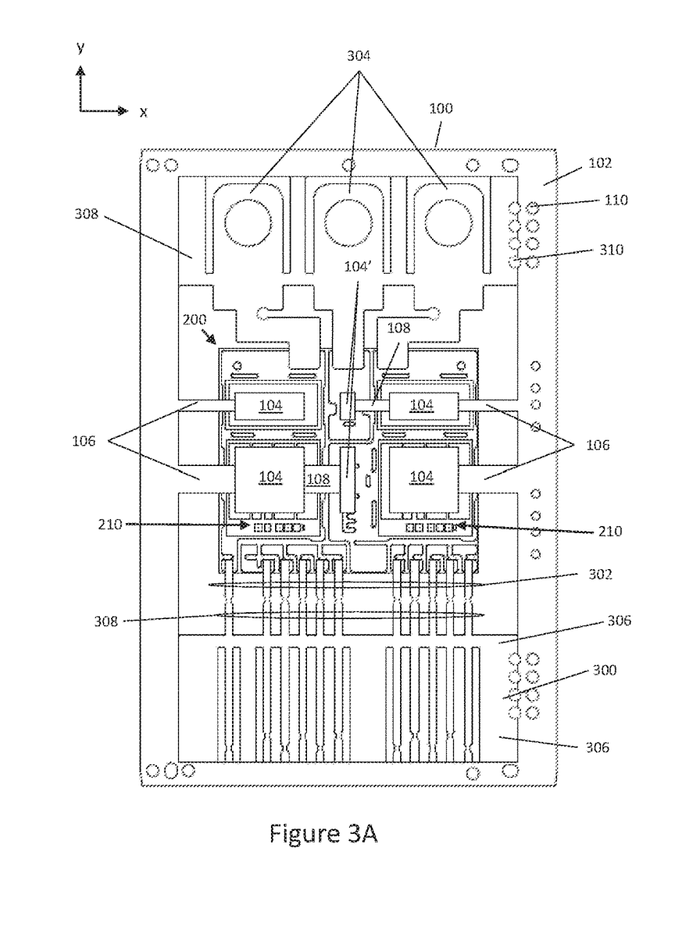
FIG. 3A illustrates a top plan view.
Figure 3B:
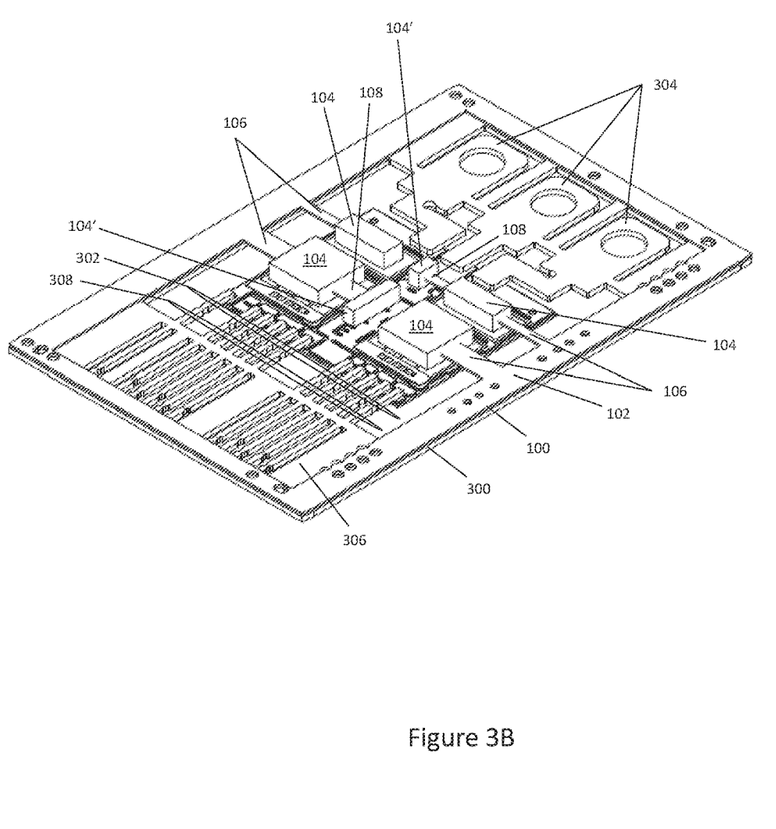
FIG. 3B illustrates a corresponding top-side perspective view.
Figure 3C:
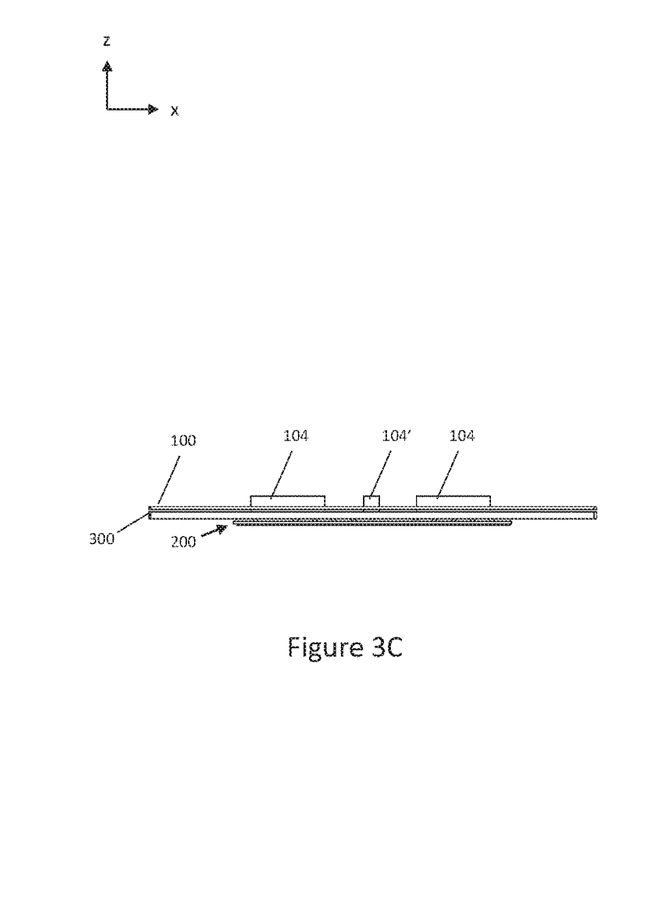
FIG. 3C illustrates a side view taken in the y-direction of FIG. 3A.
Figure 3D:
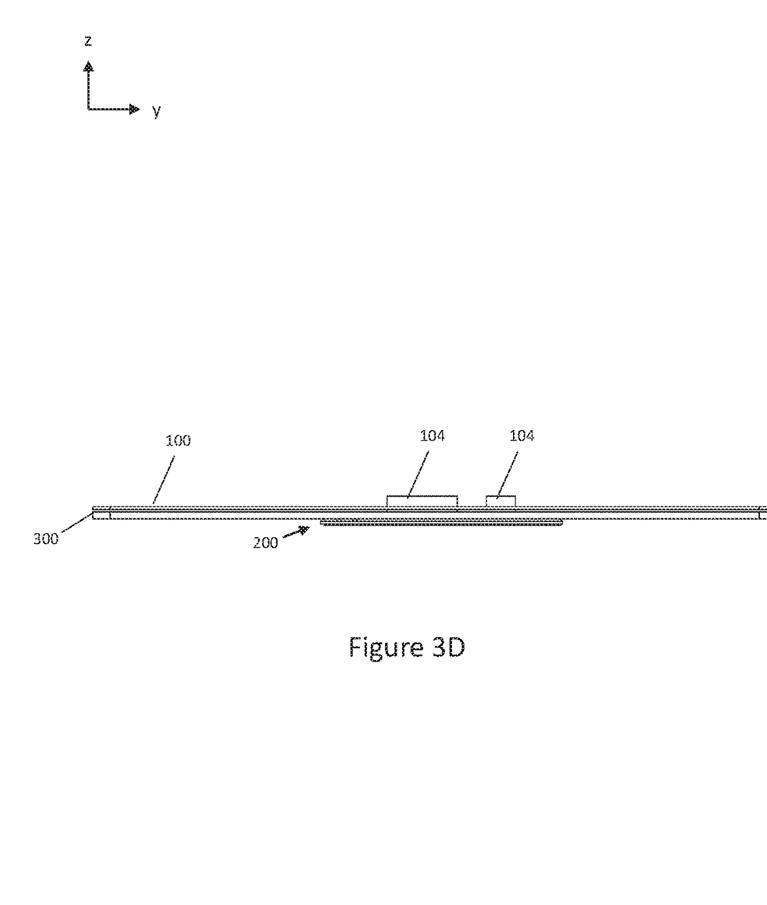
FIG. 3D illustrates a side view taken in the x-direction of FIG. 3A.

FIGS. 3A through 3D illustrate a method of frame handling during semiconductor package production. FIG. 3A illustrates a top plan view. FIG. 3B illustrates a corresponding top-side perspective view. FIG. 3C illustrates a side view taken in the y-direction of FIG. 3A. FIG. 3D illustrates a side view taken in the x-direction of FIG. 3A. The z-direction in FIGS. 3C and 3D indicates thickness or height direction.

The method of frame handling includes providing a lead frame 300 having leads 302, 304 secured to a periphery 306 of the lead frame 302 by tie bars 308. Some leads 302 of the lead frame 300 may provide I/O type connections such as gate and telemetry connections, whereas other leads 304 of the lead frame 300 may provide power (e.g. source/emitter and drain/collector) and output connections, e.g., as previously described herein in connection with a power inverter or converter.

The method of frame handling further includes aligning the multi-gauge spacer frame 100, to which the substrate 200 was previously attached, with the lead frame 300 such that the spacers 104, 104' and the tie bars 106, 108 of the multi-gauge spacer frame 100 do not contact the leads 302, 304 of the lead frame 300. The lead frame 300 may include alignment structures 310 such as holes for aiding the alignment of the multi-gauge spacer frame 100. In one embodiment, the multi-gauge spacer frame 100 is aligned with the lead frame 300 by placing the multi-gauge spacer frame 100 on the lead frame 300 such that the periphery 102 of the multi-gauge spacer frame 100 is aligned with and contacts the periphery 306 of the lead frame 300. Hence, only part of the lead frame periphery 306 is visible in FIG. 3A. In the case of holes as the spacer frame and lead frame alignment structures 110, 310, the alignment process may include inserting pins (not shown) into the respective alignment holes 110, 310 formed in the spacer frame 100 and lead frame 300.

In one embodiment, the tie bars 106 of the multi-gauge spacer frame 100 secure the corresponding spacers 104 to the periphery 102 of the multi-gauge spacer frame 100 in a first direction (x-direction in FIG. 3A), and at least some of the tie bars 308 of the lead frame 300 secure corresponding ones of the leads to the periphery 306 of the lead frame 300 in a second direction (y-direction in FIG. 3A) perpendicular to the first direction.

In one embodiment, the lead frame 300 is made of Cu and the multi-gauge spacer frame 100 is made of AlSiC. In another embodiment, the lead frame 300 is made of Cu (pure copper or a copper alloy) and the multi-gauge spacer frame 100 is made of Cu (pure copper or a copper alloy). Other material options are available for the lead frame 300 and multi-gauge spacer frame 100. For example, the multi-gauge spacer frame 100 may be made of any suitable thermally conductive material such as AlSiC, Cu, CuW, CuMo, Al, nickel, iron, zinc, metal alloys, plated materials such as Al with Cu, Ag or Au coating, etc., as previously described herein. Instead of Cu, the lead frame 300 may be made of an iron-nickel alloy such as alloy 42 or other metal alloys.

As previously explained herein, the spacer frame 100 may be dual-gauge or have more than 2 gauges with each gauge corresponding to a different spacer or tie bar thickness. In one embodiment, the lead frame 300 has a single gauge that corresponds to a thickness of the leads 302, 304, tie bars 308 and periphery 306 of the lead frame 300, e.g., as shown in FIGS. 3C and 3D. The inwardly positioned spacers 104' of the multi-gauge spacer frame 100 may be thicker than the outwardly positioned spacers 104, e.g., if the inwardly positioned spacers 104' are attached to the substrate 200 instead of to a semiconductor die 202 on the substrate 200.

After aligning the multi-gauge spacer frame 100 with the lead frame 300, at least some of the lead frame leads 302, 304 are connected to corresponding contact pads 204, 206 of the substrate 200, e.g., using solder or another attach material. In the case of a half bridge configuration, the electrical connection between the high-side switch device and the low-side switch device of the half bridge may be formed in part by one of the inwardly positioned spacers 104' of the multi-gauge spacer frame 100 and the corresponding tie bar 108 of the multi-gauge spacer frame 100 that connects the inwardly positioned spacer 104' to the adjacent outwardly positioned spacer 104. The spacer frame tie bar 108 may be bent downward toward the corresponding contact pad 204 of the substrate 200. The inwardly positioned spacer 104' of the multi-gauge spacer frame 100 is thicker than the adjacent outwardly positioned spacer 104 and attached to one of the contact pads 204 of the substrate 200. One of the leads 304 of the lead frame 300 is connected to this contact pad 204 to complete the corresponding electrical connection, e.g., a source/emitter connection.

Further electrical connections may be made between the semiconductor dies 202 and at least some of the substrate contact pads 204, 206 to complete the desired circuit connections, e.g., by wire bonding, ribbon bonding, metal clips, etc. These additional connections are not shown for ease of illustration and may be made before or after attaching another substrate to the side of the spacers 104, 104' that face away from the first substrate 200.

Figure 4A:
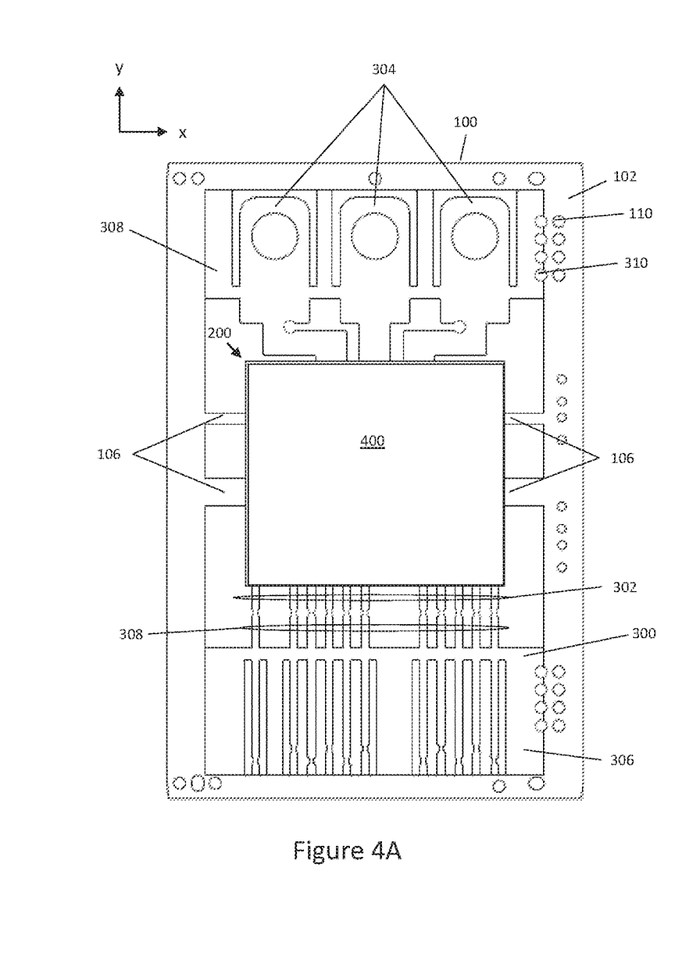
FIG. 4A illustrates a top plan view.
Figure 4B:
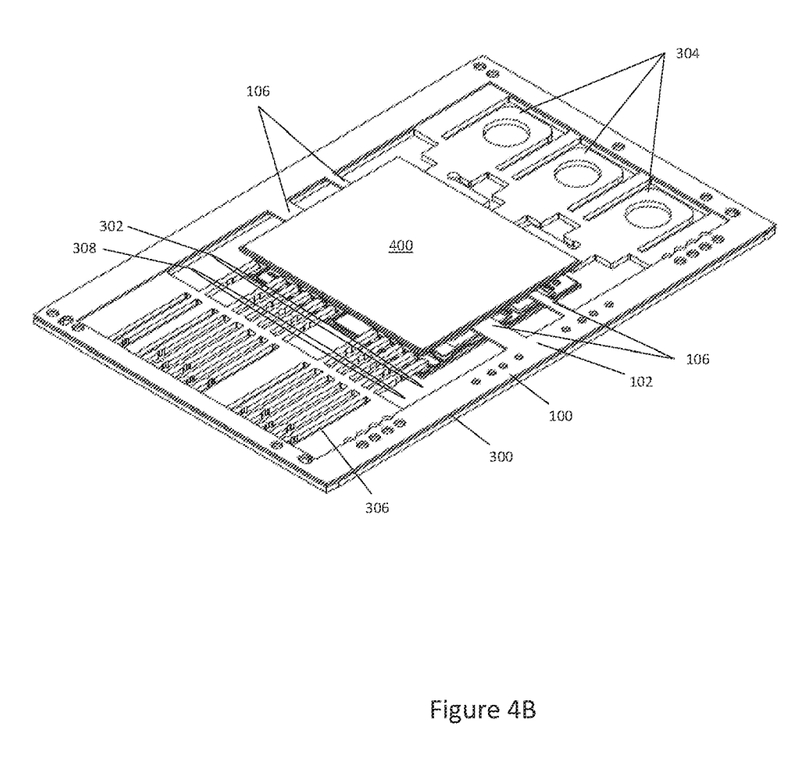
FIG. 4B illustrates a corresponding top-side perspective view.
Figure 4C:
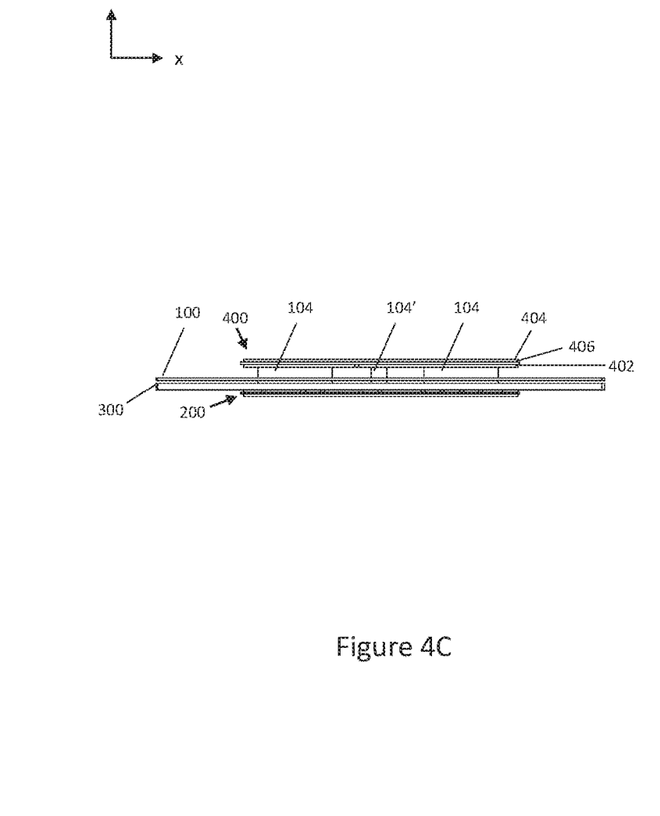
FIG. 4C illustrates a side view taken in the y-direction of FIG. 4A.
Figure 4D:
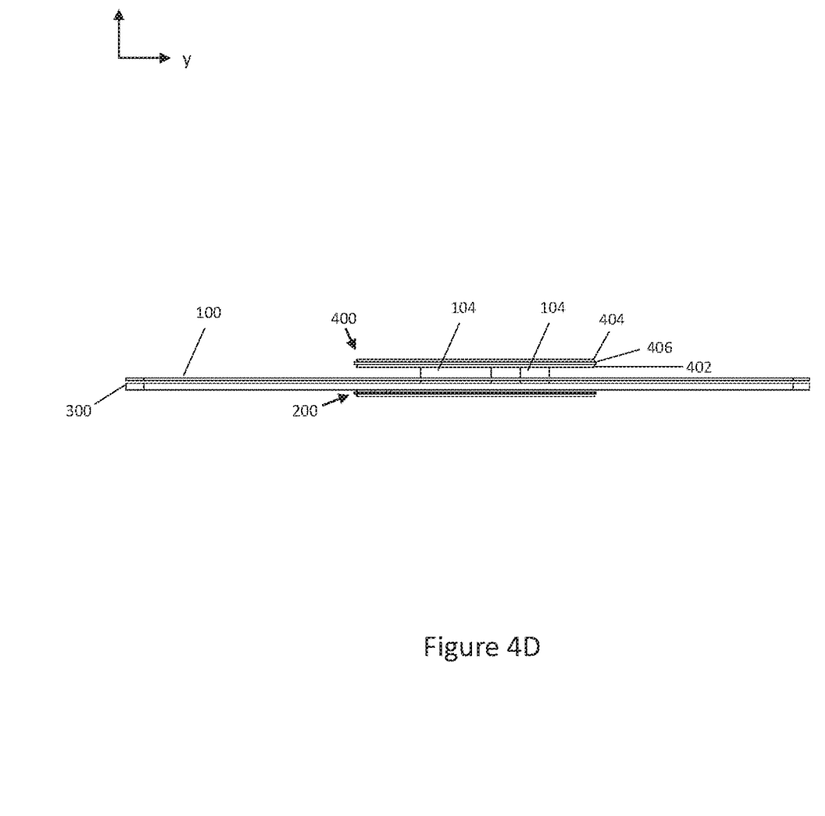
FIG. 4D illustrates a side view taken in the x-direction of FIG. 4A.

FIGS. 4A through 4D illustrate a method of attaching a second substrate 400 to the side of the spacers 104, 104' that face away from the first substrate 200. FIG. 4A illustrates a top plan view. FIG. 4B illustrates a corresponding top-side perspective view. FIG. 4C illustrates a side view taken in the y-direction of FIG. 4A. FIG. 4D illustrates a side view taken in the x-direction of FIG. 4A. The z-direction in FIGS. 4C and 4D indicates thickness or height direction.

The second substrate 400 may be a lead frame, a circuit board such as a PCB, a DBC substrate, an AMB substrate, an IMS, etc. In the case of a DBC, AMB or IMS substrate, the second substrate 400 may include first and second metallization layers 402, 404 formed on opposite sides of an electrically insulating substrate 406 such as a ceramic material, an epoxy-based layer, etc. The first metallization layer 402 may be patterned and is attached to the spacers 104, 104' of the multi-gauge spacer frame 100. The way in which the first metallization layer 402 is patterned and attached depends on the type of electrical connections to be implemented by the second substrate 400. For example, in the case of a half bridge configuration, the inwardly positioned spacers 104' of the multi-gauge spacer frame 100 may be attached to the same region of the first metallization layer 402 to complete a switch node/phase connection of the half bridge circuit. Other connections are possible and depend on the type and arrangement of the semiconductor dies 202 attached to the first substrate 200 and the circuit implemented by the semiconductor dies 202.

Figures 5A, 5B:
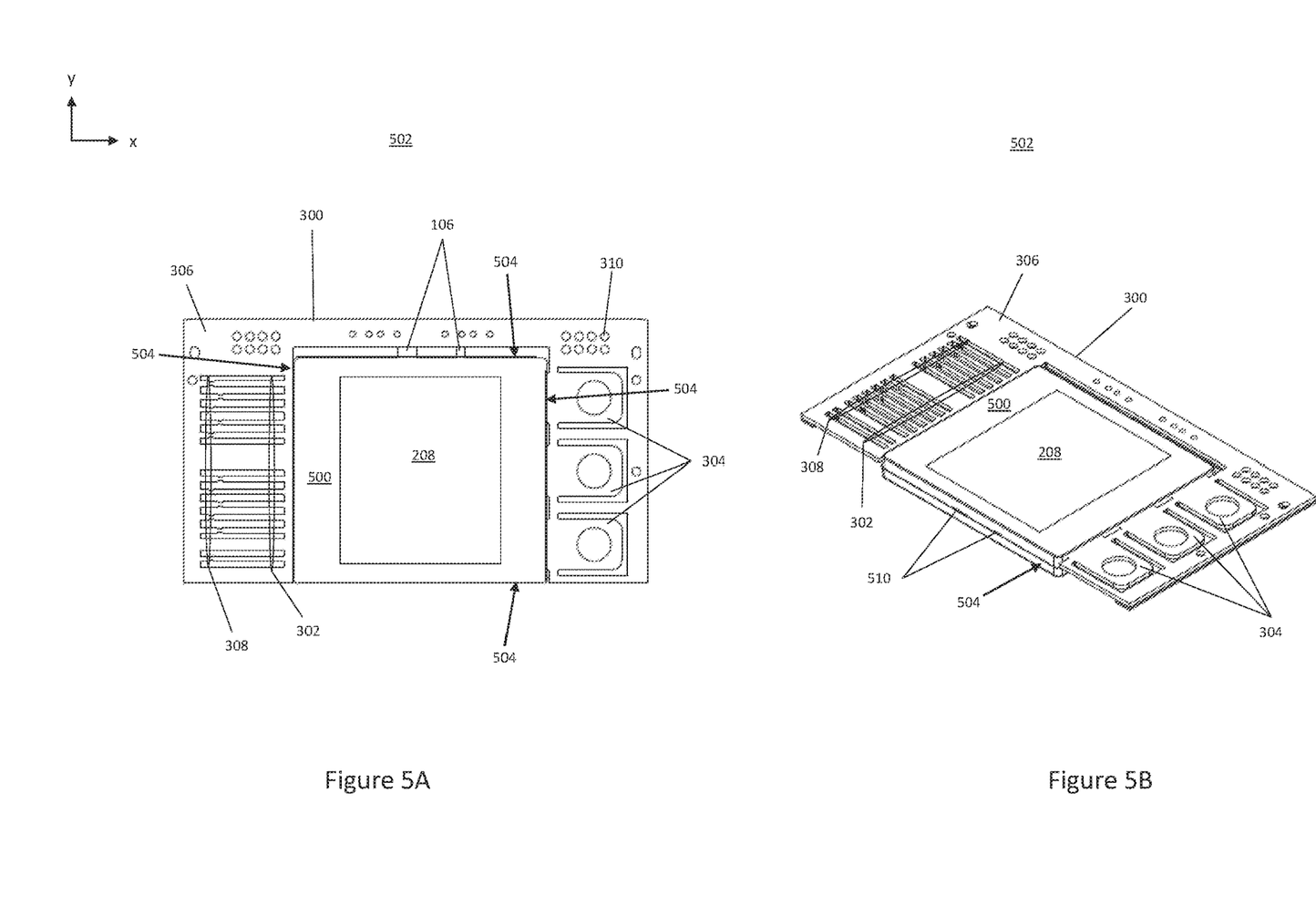
FIG. 5A illustrates a bottom plan view of the molded power semiconductor module.
FIG. 5B illustrates a corresponding bottom-side perspective view of the molded power semiconductor module.
Figure 5C:
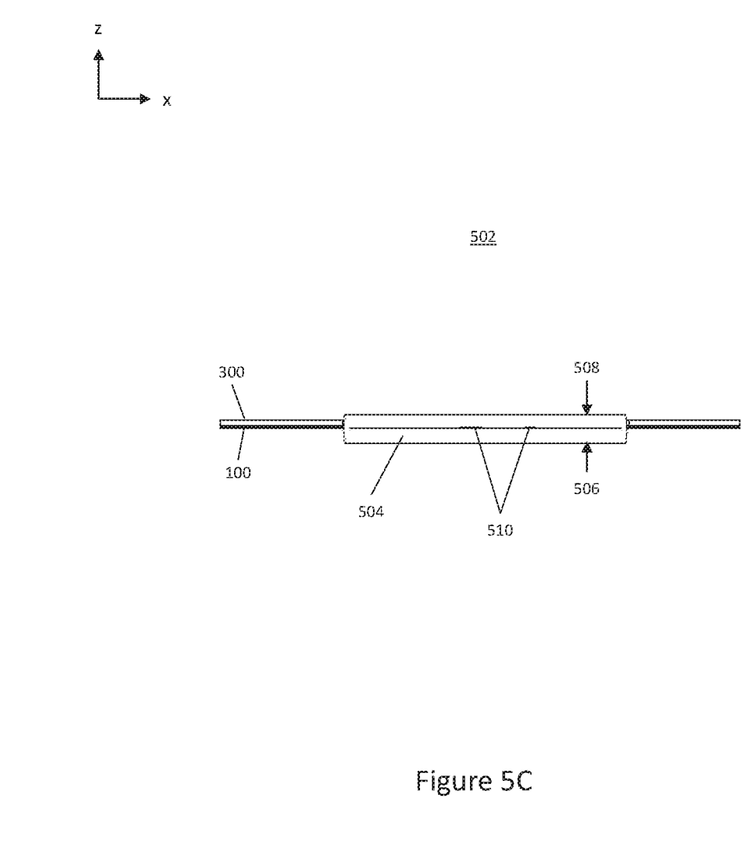
FIG. 5C illustrates a side view of the molded power semiconductor module taken in the x-direction of FIG. 5A.
Figure 5D:
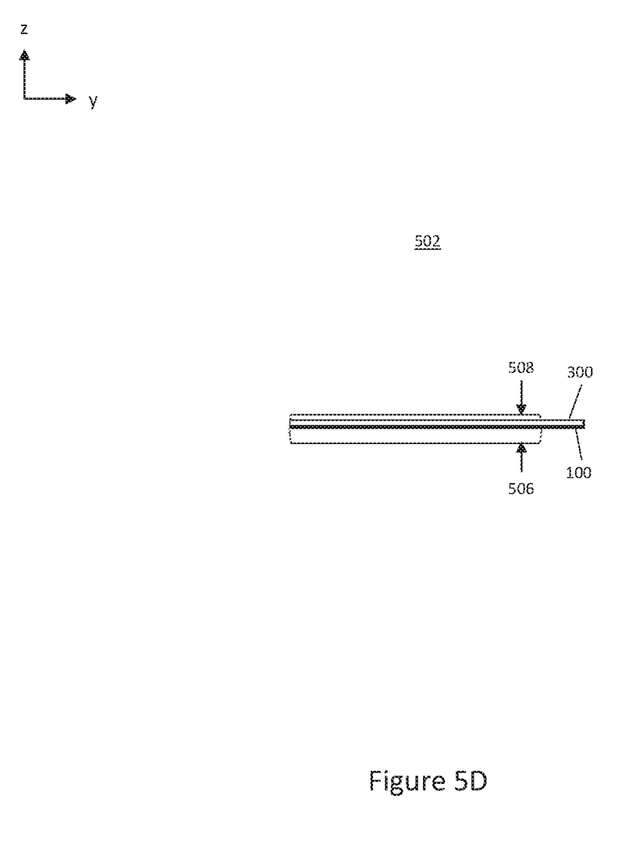
FIG. 5D illustrates a side view of the molded power semiconductor module taken in the y-direction of FIG. 5A.

FIGS. 5A through 5D illustrate a method of applying a mold compound 500 to the multi-gauge spacer frame 100, lead frame 300 and substrates 200, 400 to form a molded power semiconductor module 502. FIG. 5A illustrates a bottom plan view of the molded power semiconductor module 502. FIG. 5B illustrates a corresponding bottom-side perspective view of the molded power semiconductor module 502. FIG. 5C illustrates a side view of the molded power semiconductor module 502 taken in the x-direction of FIG. 5A. FIG. 5D illustrates a side view of the molded power semiconductor module 502 taken in the y-direction of FIG. 5A. The z-direction in FIGS. 5C and 5D indicates thickness or height of the molded power semiconductor module 502.

The mold compound 500 is applied such that the outer tie bars 106 of the multi-gauge spacer frame 100, the tie bars 308 of the lead frame 300, the side of the spacers 104, 104' facing away from the first substrate 200, and a side 208 of the first substrate 200 facing away from the spacers 104, 104' each remain at least partly uncovered by the mold compound 500. The side 208 of the first substrate 200 facing away from the spacers 104, 104' may be metallized. Although out of view in FIGS. 5A through 5D, the metallization layer 404 of the second substrate 400 disposed at the opposite side of the molded power semiconductor module 502 as the first substrate 100 may also be at least partly uncovered by the mold compound 500 to provide double-sided cooling. Any typical molding process such as injection molding, compression molding, film-assisted molding (FAM), reaction injection molding (RIM), resin transfer molding (RTM), map molding, blow molding, etc. may be used to form the mold compound 500. Common mold compounds and resins include, but are not limited to, thermoset resins, gel elastomers, encapsulants, potting compounds, composites, optical grade materials, etc.

The tie bars 308 connected to the periphery 306 of the lead frame 300 and the tie bars 106 connected to the periphery 102 of the multi-gauge spacer frame 100 are severed to separate the power semiconductor module 502 from the lead frame 300 and the multi-gauge spacer frame 100. The tie bars 106, 308 may be severed by stamping or punching, laser etching, etc. FIGS. 5A through 5B show the power semiconductor module 502 with the spacer frame tie bars 106 severed at one side face 504 of the mold compound 500. The mold compound 500 encapsulates each semiconductor die 202 and has side faces 504 that extend between first and second main surfaces 506, 508 of the mold compound 500. The tie bars 308 connected to first leads 302 of the lead frame 300 each have a severed end that is at least partly uncovered by the mold compound 500 at one of the side faces 504 of the mold compound 500. The views provided by FIGS. 5A through 5D do not show these leads 302 of the lead frame 300 severed yet, but the severed end of these leads 302 corresponds to the region of the corresponding tie bars 308 that are severed as part of the module singulation process.

As mentioned above, the spacer frame tie bars 106 have been severed at one side face 504 but not the other side faces 504 of the mold compound 500 in FIGS. 5A through 5D. At this side face 504 of the mold compound 500, the tie bars 106 of the multi-gauge spacer frame 100 connected to the outwardly positioned spacers 104 each have a severed end 510 that is at least partly uncovered by the mold compound 500. All severed tie bars 106, 308 will have a severed end that is at least partly uncovered by the mold compound 500 after the tie bar severing process is complete. Also as previously explained above, tie bars 108 of the multi-gauge spacer frame 100 that interconnect the inwardly positioned spacers 104' to respective outwardly positioned spacers 104 without contacting the periphery 102 of the multi-gauge spacer frame 100 may remain unsevered to interconnect the corresponding spacers 104', 104. For example, each unsevered tie bar 108 may form part of an electrical connection for a power inverter or converter and is encapsulated within the mold compound 500.

Unlike metal clips, the dimensions of each spacer 104, 104' of the multi-gauge spacer frame 100 may be limited to the footprint of the structures (e.g. semiconductor die pad, metal region of a substrate, etc.) to which the spacer 104, 104' is attached. Each spacer 104, 104' of the multi-gauge spacer frame 100 provides vertical electrical and thermal connections between the structures to which the spacer 104, 104' is attached at opposite ends (e.g. substrate-to-substrate or die-to-substrate electrical and thermal connections).

Although the present disclosure is not so limited, the following numbered examples demonstrate one or more aspects of the disclosure.

Example 1. A method of frame handling during semiconductor package production, the method comprising: providing a lead frame having leads secured to a periphery of the lead frame by first tie bars; providing a multi-gauge spacer frame having spacers secured to a periphery of the spacer frame by second tie bars, the spacers being thicker than the second tie bars; and aligning the multi-gauge spacer frame with the lead frame such that the spacers and the second tie bars of the multi-gauge spacer frame do not contact the leads of the lead frame.

Example 2. The method of example 1, wherein aligning the multi-gauge spacer frame with the lead frame comprises placing the multi-gauge spacer frame on the lead frame such that the periphery of the multi-gauge spacer frame is aligned with and contacts the periphery of the lead frame.

Example 3. The method of example 1 or 2, wherein the second tie bars secure the spacers to the periphery of the multi-gauge spacer frame in a first direction, and wherein at least some of the first tie bars secure corresponding ones of the leads to the periphery of the lead frame in a second direction perpendicular to the first direction.

Example 4. The method of any of examples 1 through 3, wherein the lead frame is made of Cu, and wherein the multi-gauge spacer frame is made of AlSiC.

Example 5. The method of any of examples 1 through 3, wherein the lead frame is made of Cu, and wherein the multi-gauge spacer frame is made of Cu.

Example 6. The method of any of examples 1 through 5, wherein one or more of the second tie bars interconnect at least two of the spacers without contacting the periphery of the multi-gauge spacer frame.

Example 7. The method of any of examples 1 through 6, wherein a first one of the spacers is laterally spaced inward from a second one of the spacers with respect to the periphery of the multi-gauge spacer frame, and wherein one or more of the second tie bars interconnect the first one and the second one of the spacers without contacting the periphery of the multi-gauge spacer frame.

Example 8. The method of any of examples 1 through 7, wherein the multi-gauge spacer frame is a dual-gauge spacer frame having a first gauge that corresponds to a thickness of the spacers and a second gauge that corresponds to a thickness of the second tie bars and the periphery of the dual-gauge spacer frame, and wherein the first gauge is lower than the second gauge.

Example 9. The method of example 8, wherein the lead frame has a single gauge that corresponds to a thickness of the leads, the first tie bars and the periphery of the lead frame.

Example 10. The method of any of examples 1 through 9, wherein at least one of the spacers is thicker than one or more other ones of the spacers.

Example 11. A method of assembling a power semiconductor module, the method comprising: aligning a lead frame and a multi-gauge spacer frame with a first substrate, the lead frame comprising leads secured to a periphery of the lead frame by first tie bars, the multi-gauge spacer frame comprising spacers secured to a periphery of the spacer frame by second tie bars, wherein the spacers are thicker than the leads, the first tie bars and the second tie bars; connecting at least some of the leads to contact pads of the first substrate; attaching at least some of the spacers to semiconductor dies on the first substrate, at a side of the semiconductor dies facing away from the first substrate; applying a mold compound such that the first tie bars, the second tie bars, the side of the spacers facing away from the first substrate, and a side of the first substrate facing away from the spacers each remain at least partly uncovered by the mold compound; and severing the first tie bars connected to the periphery of the lead frame and the second tie bars connected to the periphery of the multi-gauge spacer frame, to separate the power semiconductor module from the lead frame and the multi-gauge spacer frame.

Example 12. The method of example 11, wherein one or more of the second tie bars interconnect at least two of the spacers without contacting the periphery of the multi-gauge spacer frame, and wherein the one or more of the second tie bars each remain intact after the power semiconductor module is separated from the lead frame and the spacer frame.

Example 13. The method of example 11 or 12, wherein the semiconductor dies on the first substrate form part of a power inverter or converter, wherein a first one of the spacers is laterally spaced inward from a second one of the spacers with respect to the periphery of the multi-gauge spacer frame, wherein a first one of the second tie bars interconnects the first one and the second one of the spacers without contacting the periphery of the multi-gauge spacer frame and forms part of an electrical connection for the power inverter or converter, and wherein the first one of the second tie bars remains intact after the power semiconductor module is separated from the lead frame and the spacer frame.

Example 14. The method of example 13, wherein the first one of the spacers is thicker than the second one of the spacers, wherein the first one of the spacers is attached to a first one of the contact pads of the first substrate, and wherein a first one of the leads is connected to the first one of the contact pads to complete the electrical connection.

Example 15. The method of example 13, wherein the first one of the spacers is attached to a first one of the contact pads of the first substrate, wherein a first one of the leads is connected to the first one of the contact pads to complete the electrical connection, and wherein the first one of the second tie bars is bent downward toward the first one of the contact pads.

Example 16. The method of any of examples 11 through 15, wherein the multi-gauge spacer frame is a dual-gauge spacer frame having a first gauge that corresponds to a thickness of the spacers and a second gauge that corresponds to a thickness of the second tie bars and the periphery of the dual-gauge spacer frame, and wherein the first gauge is lower than the second gauge.

Example 17. The method of any of examples 11 through 16, further comprising: prior to applying the mold compound, attaching a second substrate to the side of the spacers facing away from the first substrate, wherein a side of the second substrate facing away from the spacers remains at least partly uncovered by the mold compound.

Example 18. A power semiconductor module, comprising: a plurality of semiconductor dies attached to a first substrate; first leads of a lead frame connected to contact pads of the first substrate; first spacers of a multi-gauge spacer frame attached to the semiconductor dies at a side of the semiconductor dies facing away from the first substrate;

a mold compound encapsulating the semiconductor dies and having side faces that extend between a first main surface and a second main surface of the mold compound; first tie bars connected to the first leads and each having a severed end that is at least partly uncovered by the mold compound at one of the side faces of the mold compound; and second tie bars connected to the first spacers and each having a severed end that is at least partly uncovered by the mold compound at one of the side faces of the mold compound, wherein a side of the first spacers facing away from the first substrate is at least partly uncovered by the mold compound at the first main surface of the mold compound, wherein a side of the first substrate facing away from the first spacers is at least partly uncovered by the mold compound at the second main surface of the mold compound.

Example 19. The power semiconductor module of example 18, further comprising: a second spacer laterally spaced inward from the first spacers; and an unsevered tie bar interconnecting the second spacer and an adjacent one of the first spacers.

Example 20. The power semiconductor module of example 19, wherein the semiconductor dies on the first substrate form part of a power inverter or converter, and wherein the unsevered tie bar forms part of an electrical connection for the power inverter or converter and is encapsulated within the mold compound.

Example 21. The power semiconductor module of any of examples 19 through 20, wherein the second spacer is attached to a first one of the contact pads of the first substrate, and wherein a first one of the first leads is connected to the first one of the contact pads to complete the electrical connection.

Example 22. The power semiconductor module of example 21, wherein the semiconductor dies on the first substrate are electrically connected in a half bridge configuration, and wherein the first one of the first leads provides a phase of the half bridge.

Example 23. The power semiconductor module of any of examples 18 through 22, further comprising: a second substrate attached to the side of the spacers facing away from the first substrate, wherein a side of the second substrate facing away from the first spacers is at least partly uncovered by the mold compound.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of frame handling during semiconductor package production, the method comprising:
    providing a lead frame having leads secured to a periphery of the lead frame by first tie bars;
    providing a multi-gauge spacer frame having spacers secured to a periphery of the multi-gauge spacer frame by second tie bars, the spacers being thicker than the second tie bars; and
    aligning the multi-gauge spacer frame with the lead frame such that the spacers and the second tie bars of the multi-gauge spacer frame do not contact the leads of the lead frame.

2. The method of claim 1, wherein aligning the multi-gauge spacer frame with the lead frame comprises placing the multi-gauge spacer frame on the lead frame such that the periphery of the multi-gauge spacer frame is aligned with and contacts the periphery of the lead frame.

3. The method of claim 1, wherein the second tie bars secure the spacer elements to the periphery of the multi-gauge spacer frame in a first direction, and wherein at least some of the first tie bars secure corresponding ones of the leads to the periphery of the lead frame in a second direction perpendicular to the first direction.

4. The method of claim 1, wherein the lead frame is made of Cu, and wherein the multi-gauge spacer frame is made of AlSiC.

5. The method of claim 1, wherein the lead frame is made of Cu, and wherein the multi-gauge spacer frame is made of Cu.

6. The method of claim 1, wherein one or more of the second tie bars interconnect at least two of the spacers without contacting the periphery of the multi-gauge spacer frame.

7. The method of claim 1, wherein a first one of the spacers is laterally spaced inward from a second one of the spacers with respect to the periphery of the multi-gauge spacer frame, and wherein one or more of the second tie bars interconnect the first one and the second one of the spacers without contacting the periphery of the multi-gauge spacer frame.

8. The method of claim 1, wherein the multi-gauge spacer frame is a dual-gauge spacer frame having a first gauge that corresponds to a thickness of the spacers and a second gauge that corresponds to a thickness of the second tie bars and the periphery of the dual-gauge spacer frame, and wherein the first gauge is lower than the second gauge.

9. The method of claim 8, wherein the lead frame has a single gauge that corresponds to a thickness of the leads, the first tie bars and the periphery of the lead frame.

10. The method of claim 1, wherein at least one of the spacers is thicker than one or more other ones of the spacers.

11. A method of assembling a power semiconductor module, the method comprising:
    aligning a lead frame and a multi-gauge spacer frame with a first substrate, the lead frame comprising leads secured to a periphery of the lead frame by first tie bars, the multi-gauge spacer frame comprising spacers secured to a periphery of the spacer frame by second tie bars, wherein the spacers are thicker than the leads, the first tie bars and the second tie bars;
    connecting at least some of the leads to contact pads of the first substrate;
    attaching at least some of the spacers to semiconductor dies on the first substrate, at a side of the semiconductor dies facing away from the first substrate;

applying a mold compound such that the first tie bars, the second tie bars, the side of the spacers facing away from the first substrate, and a side of the first substrate facing away from the spacers each remain at least partly uncovered by the mold compound; and severing the first tie bars connected to the periphery of the lead frame and the second tie bars connected to the periphery of the multi-gauge spacer frame, to separate the power semiconductor module from the lead frame and the multi-gauge spacer frame.

12. The method of claim 11, wherein one or more of the second tie bars interconnect at least two of the spacers without contacting the periphery of the multi-gauge spacer frame, and wherein the one or more of the second tie bars each remain intact after the power semiconductor module is separated from the lead frame and the spacer frame.

13. The method of claim 11, wherein the semiconductor dies on the first substrate form part of a power inverter or converter, wherein a first one of the spacers is laterally spaced inward from a second one of the spacers with respect to the periphery of the multi-gauge spacer frame, wherein a first one of the second tie bars interconnects the first one and the second one of the spacers without contacting the periphery of the multi-gauge spacer frame and forms part of an electrical connection for the power inverter or converter, and wherein the first one of the second tie bars remains intact after the power semiconductor module is separated from the lead frame and the spacer frame.

14. The method of claim 13, wherein the first one of the spacers is thicker than the second one of the spacers, wherein the first one of the spacers is attached to a first one of the contact pads of the first substrate, and wherein a first one of the leads is connected to the first one of the contact pads to complete the electrical connection.

15. The method of claim 13, wherein the first one of the spacers is attached to a first one of the contact pads of the first substrate, wherein a first one of the leads is connected to the first one of the contact pads to complete the electrical connection, and wherein the first one of the second tie bars is bent downward toward the first one of the contact pads.

16. The method of claim 11, wherein the multi-gauge spacer frame is a dual-gauge spacer frame having a first gauge that corresponds to a thickness of the spacers and a second gauge that corresponds to a thickness of the second tie bars and the periphery of the dual-gauge spacer frame, and wherein the first gauge is lower than the second gauge.

17. The method of claim 11, further comprising:
prior to applying the mold compound, attaching a second substrate to the side of the spacers facing away from the first substrate,
wherein a side of the second substrate facing away from the spacers remains at least partly uncovered by the mold compound.

\* \* \* \* \*